(12) United States Patent
Ding et al.

(10) Patent No.: US 9,627,416 B2
(45) Date of Patent: Apr. 18, 2017

(54) ARRAY SUBSTRATE AND METHOD FOR MANUFACTURING THE SAME, DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Hong Ding, Shanghai (CN); Lingxiao Du, Shanghai (CN); Qijun Yao, Shangai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 11 days.

(21) Appl. No.: 14/716,728

(22) Filed: May 19, 2015

(65) Prior Publication Data

US 2016/0190159 A1 Jun. 30, 2016

(30) Foreign Application Priority Data

Dec. 25, 2014 (CN) .......................... 2014 1 0842456

(51) Int. Cl.
| | | |
|---|---|---|
| *H01L 27/12* | (2006.01) | |
| *G02F 1/1362* | (2006.01) | |
| *H01L 27/32* | (2006.01) | |
| *G02F 1/1333* | (2006.01) | |

(52) U.S. Cl.
CPC ...... *H01L 27/124* (2013.01); *G02F 1/133345* (2013.01); *G02F 1/136286* (2013.01); *H01L 27/1222* (2013.01); *H01L 27/1259* (2013.01); *H01L 27/3241* (2013.01); *H01L 27/3248* (2013.01); *G02F 1/13338* (2013.01)

(58) Field of Classification Search
CPC ............... H01L 27/124; H01L 27/3241; H01L 27/3244; H01L 27/3248
See application file for complete search history.

(56) References Cited

U.S. PATENT DOCUMENTS

| | | |
|---|---|---|
| 2014/0125626 A1 | 5/2014 | Yang et al. |
| 2015/0309634 A1* | 10/2015 | Lee ........................ G06F 3/0412 345/173 |

* cited by examiner

*Primary Examiner* — Phat X Cao
(74) *Attorney, Agent, or Firm* — Anova Law Group, PLLC

(57) ABSTRACT

An array substrate is disclosed. The array substrate includes gate lines and data lines, and first and second signal lines. A first data line is between first and second pixel units, respectively including first and second film transistors. A first gate line is electrically connected to the gate electrodes of the first and second film transistors. The second electrode of the second film transistor is electrically connected to the first data line, and the second electrode of the first film transistor is electrically connected to the first signal line. The array substrate also includes a common electrode layer partially located between a third pixel unit and the first pixel unit, which is electrically insulated. In addition, a portion of the common electrode layer between the first pixel unit and the second pixel unit overlaps the first data line.

16 Claims, 7 Drawing Sheets

ARRAY SUBSTRATE AND METHOD FOR MANUFACTURING THE SAME, DISPLAY DEVICE

CROSS-REFERENCES TO RELATED APPLICATIONS

This application claims the benefit of priority to Chinese Patent Application No. 201410842456.2, filed with the Chinese Patent Office on Dec. 25, 2014 and entitled "ARRAY SUBSTRATE AND METHOD FOR MANUFACTURING THE SAME, DISPLAY DEVICE", the content of which is incorporated herein by reference in its entirety.

BACKGROUND OF THE INVENTION

Compared with a touch display device with a touch panel disposed on a liquid crystal display panel, a touch display device with a touch panel integrated into a liquid crystal display panel becomes more popular currently due to reduction of baseplates and thinner thickness. The touch display device with the touch panel integrated into the liquid crystal display panel may be in an on-cell structure or an in-cell structure. In the in-cell structure, the touch function is implemented with liquid crystal pixels, and in the on-cell structure, the touch function is implemented between a color filter substrate and a polarizing baseplate.

For the touch display device with the in-cell structure, a common electrode of the liquid crystal display panel needs to be divided into multiple pieces to implement the touch function. Therefore, the common electrode is etched and slotted. Conventionally, an opening region of the common electrode is disposed between two adjacent pixel units in the same row. That is, the opening region of the common electrode is disposed between pixel columns. A data line is also between two adjacent pixel units in the same row, and thus the opening region is opposite to the data line, thereby resulting in leakage of electric field of the data line and thus leakage of light of the display panel. The electric field of the data line can be shielded theoretically by disposing metal wiring between the opening regions. However, it is difficult to control the width and position of the metal wiring. The process is difficult, and if the width of the metal wiring is not large enough or the metal wiring is not aligned to the data line exactly, the leakage of light still occurs.

BRIEF DESCRIPTION OF THE DRAWINGS

The accompanying drawings needed to be used in the description of the embodiments or the conventional technology will be described briefly as follows, so that the technical solutions according to the embodiments of the present disclosure or according to the conventional technology will become clearer. It is obvious that the accompanying drawings in the following description are only some embodiments of the present disclosure. For those skilled in the art, other accompanying drawings may be obtained according to these accompanying drawings without any creative work.

DETAILED DESCRIPTION OF THE PREFERRED EMBODIMENTS

The technical solution of the embodiments of the present disclosure will be described clearly and completely as follows in conjunction with the accompanying drawings of the embodiments of the present disclosure. It is obvious that the described embodiments are only a few of the embodiments of the present disclosure. All the other embodiments obtained by those skilled in the art based on the embodiments in the present disclosure without any creative work belong to the scope of the present disclosure.

Figure 1:
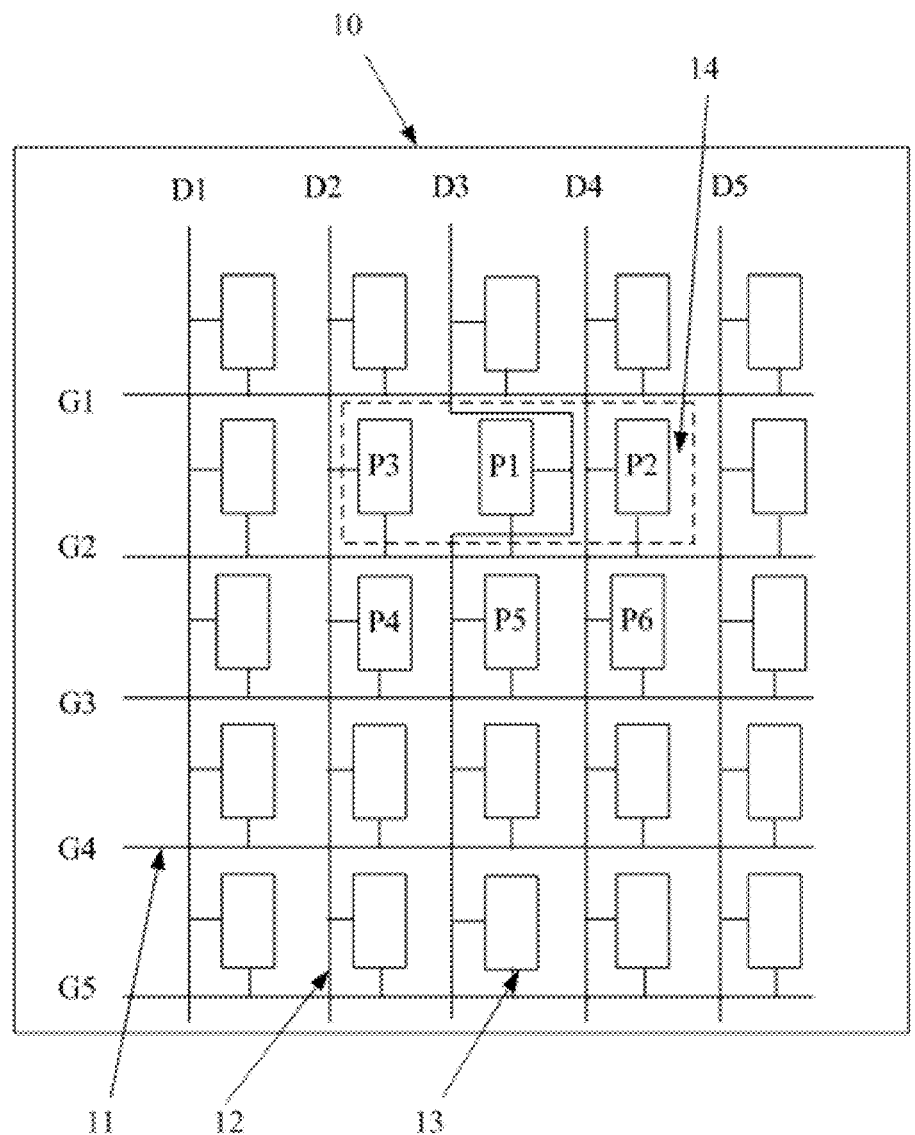
FIG. 1 is a schematic structural diagram of an array substrate according to an embodiment of the present disclosure.
Figure 2:
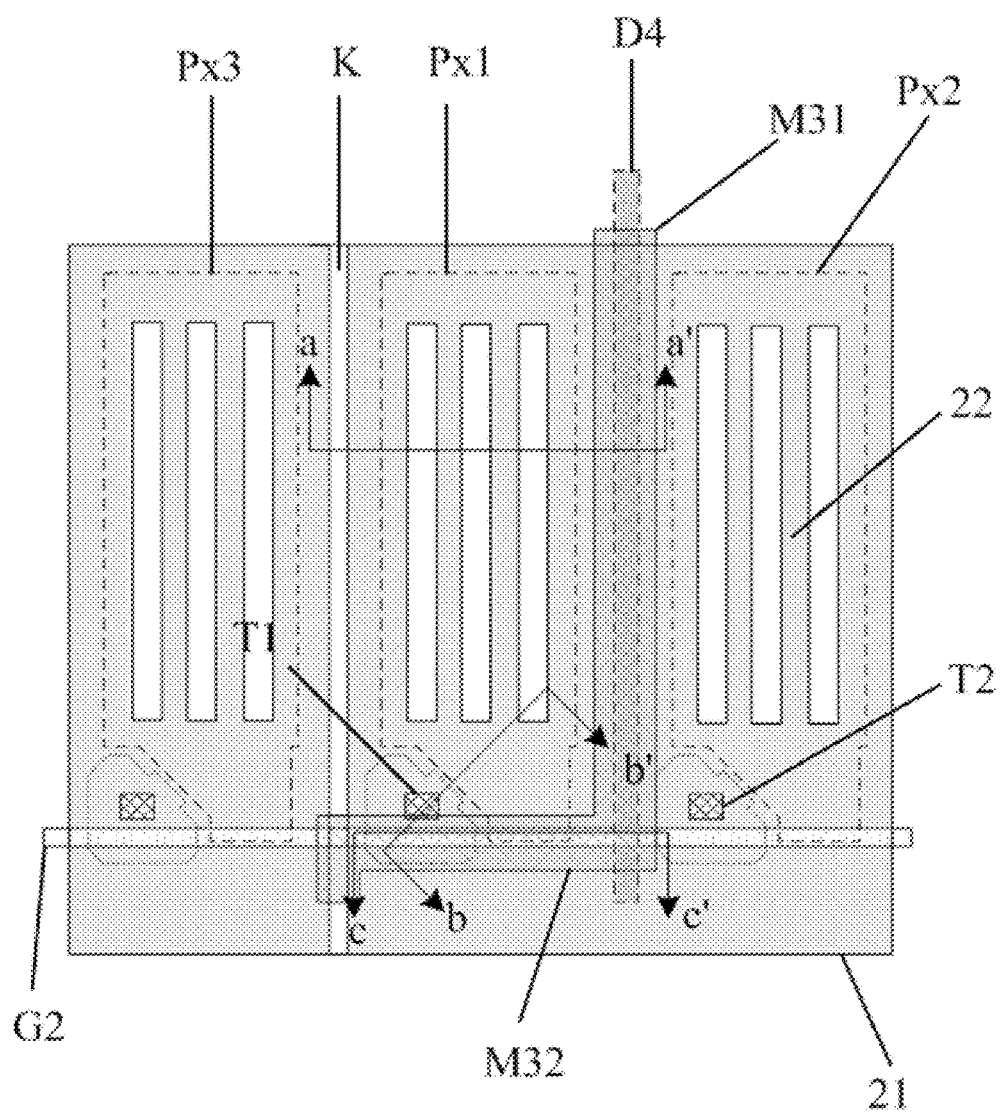
FIG. 2 is an enlarged local view of the array substrate shown in FIG. 1 according to an embodiment of the present disclosure.

It is provided an array substrate according to an embodiment of the present disclosure. Reference is made to FIG. 1 and FIG. 2. FIG. 1 is a schematic structural diagram of the array substrate according to the embodiment of the present disclosure, and FIG. 2 is an enlarged local view of the array substrate shown in FIG. 1 according to an embodiment of the present disclosure.

The array substrate includes a substrate 10. Multiple gate lines 11 and multiple data lines 12 are disposed on the substrate 10. The gate lines 11 and the data lines 12 are insulated from each other and cross each other to define multiple pixel units 13. The multiple pixel units 13 include at least a first set of pixel units 14. The first set of pixel units 14 includes a first pixel unit P1, a second pixel unit P2 and a third pixel unit P3. A first data line D4 is disposed between the first pixel unit P1 and the second pixel unit P2.

A first insulating layer is disposed above the first data line D4. A first signal line M31 and a second signal line M32, which are electrically connected to each other, are disposed on the first insulating layer.

The first pixel unit P1 includes a first film transistor T1, and the second pixel unit P2 includes a second film transistor T2. In the embodiment, each film transistor includes a gate electrode, a first electrode and a second electrode.

A first gate line G2 is electrically connected to the gate electrode of the first film transistor T1 and the gate electrode of the second film transistor T2.

The second electrode of the second film transistor T2 is electrically connected to the first data line D4, and the second electrode of the first film transistor T1 is electrically connected to the first signal line M31. It is to be noted that, for the above film transistor (the first film transistor and the second film transistor) in the array substrate, the second electrode is a drain electrode if the first electrode is a source electrode; or the second electrode is a source electrode if the first electrode is a drain electrode. The first electrode and the second electrode of the film transistor may be defined according to actual process condition in manufacturing the array substrate, which is not limited in the present disclosure.

A second insulating layer is disposed on the first signal line M31 and the second signal line M32. A common electrode layer 21 is disposed on the second insulating layer. A region of the common electrode layer 21 between the third pixel unit P3 and the first pixel unit P1 is electrically insulated and the electrically insulated region of the common electrode layer 21 is a common electrode opening region K. A projection of a region of the common electrode layer 21 between the first pixel unit P1 and the second pixel unit P2 on the first data line D4 is at least partly overlapped with the first data line D4.

FIG. 1 illustrates an array structure with 5*5 pixel units, including 5 gate lines 11, namely gate line G1 to gate line G5, and 5 data lines 12, namely data line D1 to data line D5. The number of pixel rows and the number of pixel columns may be any positive integers, which are not limited to the embodiment shown in FIG. 1.

The three pixel units of the first set of pixel units 14 are the third pixel unit P3, the first pixel unit P1 and the second pixel unit P2 in sequence in the pixel-row direction (from left to right as shown in FIG. 1).

A projection of the first signal line M31 on the first data line D4 is at least partly overlapped with the first data line D4. That is, the first signal line M31 is at least partly overlapped with the first data line D4 in the direction perpendicular to the array substrate. A projection of the second signal line M32 on the first gate line G2 is at least partly overlapped with the first gate line G2. That is, the second signal line M32 is at least partly overlapped the first gate line G2 in the direction perpendicular to the array substrate.

In FIG. 2, corresponding to the structure shown in FIG. 1, the first data line D4 is a part of the data line D4 in the region of the first set of pixel units 14, the first signal line M31 is a part of the data line D3 in the region of the first set of pixel units 14 and in the pixel-column direction, and the second signal line M32 is a part of the data line D3 in the region of the first set of pixel units 14 and in the pixel-row direction.

The array substrate of the embodiment may be as follows: the common electrode layer is disposed above the pixel electrode. In this case, a gate electrode is disposed on the substrate, a gate insulating layer is disposed on the gate electrode, an active layer is disposed on the gate insulating layer, a metal layer where the first electrode and the second electrode of each film transistor and the data lines are located is disposed on the active layer, the pixel electrode is disposed on the metal layer where the first electrode and the second electrode of each film transistor and the data lines are located, with the pixel electrode being electrically connected to the first electrode, and the first insulating layer is disposed on the pixel electrode. A first via hole is provided on the first insulating layer, and the first signal line is electrically connected to the second electrode through the first via hole. An insulating layer may be disposed between the pixel electrode and the first electrodes, and the pixel electrode and the first electrode is electrically connected through a via hole. Alternatively, the insulating layer may not be disposed between the pixel electrode and the first electrode, and in this case, the pixel electrode and the first electrode may be partly overlapped with each other and be electrically connected to each other by means of overlap connection.

Specifically, the pixel electrode of each pixel unit is disposed between the common electrode layer 21 and the substrate, as shown in FIG. 2. The first pixel unit P1 includes a pixel electrode Px1, the second pixel unit P2 includes a pixel electrode Px2, and the third pixel unit P3 includes a pixel electrode Px3. At this point, in order to generate a controllable electric field between the pixel electrodes and the common electrode layer for driving the liquid crystal layer, the region of the common electrode layer 21 opposite to the pixel electrode needs to be etched to form an electrode structure including multiple stripe electrodes 22. There may be one or more stripes for each pixel electrode. A pixel unit includes a film transistor and its corresponding pixel electrode. For example, the first pixel unit P1 includes the first pixel electrode Px1 and the film transistor T1.

Figure 3:
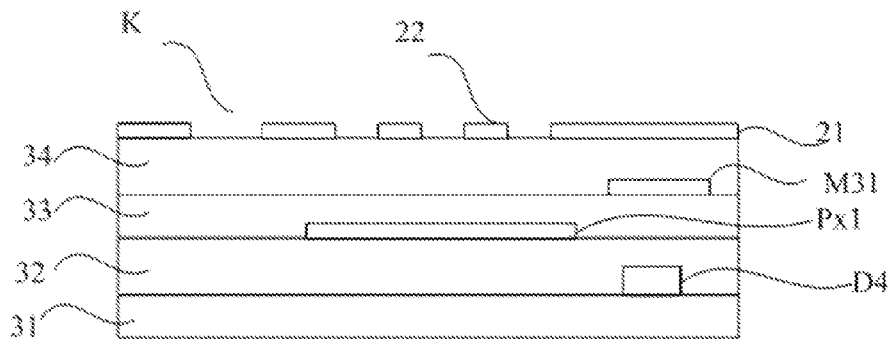
FIG. 3 is a cross-sectional view of the array substrate shown in FIG. 2 that is taken along aa'.
Figure 4:
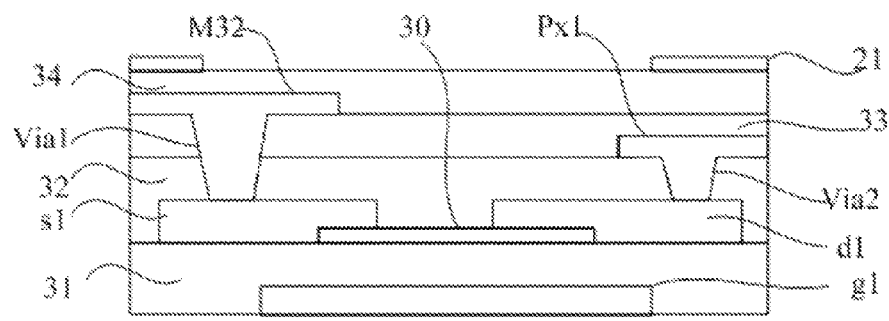
FIG. 4 is a cross-sectional view of the array substrate shown in FIG. 2 that is taken along bb'.
Figure 5:
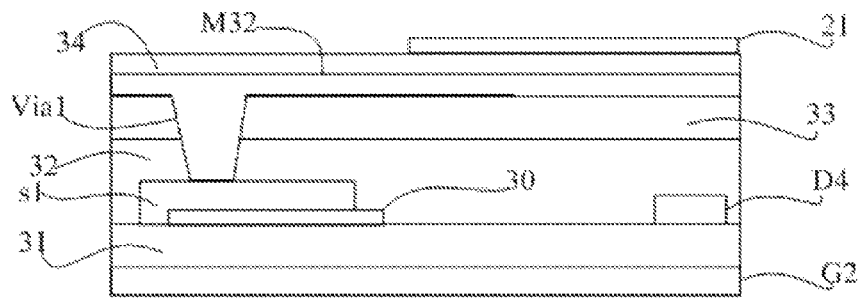
FIG. 5 is a cross-sectional view of the array substrate shown in FIG. 2 that is taken along cc'.

Reference is made to FIG. 3 to FIG. 5. FIG. 3 is a cross-sectional view of the array substrate shown in FIG. 2 that is taken along aa'. FIG. 4 is a cross-sectional view of the array substrate shown in FIG. 2 that is taken along bb'. FIG. 5 is a cross-sectional view of the array substrate shown in FIG. 2 that is taken along cc'. The embodiment shown in FIG. 3 to FIG. 5 is described by taking an example in which the drain electrode of the film transistor is the first electrode and the source electrode of the film transistor is the second electrode. At a location corresponding to the first pixel unit P1 and a location corresponding to the region between the first pixel unit P1 and the second pixel unit P2, a gate electrode g1 of the first pixel unit P1 and a first gate line G2 are disposed on the surface of the substrate; the gate electrode g1 and the first gate line G2 are covered with a gate electrode insulating layer 31; an active layer 30 is disposed on the surface of the gate electrode insulating layer 31; a metal layer where the source electrode s1 of the first film transistor T1, the drain electrode d1 of the film transistor T1 and the first data line D4 are located is disposed on the active layer 30; the surfaces of the source electrode s1, the drain electrode d1 and the first data line D4 are cover with an insulating layer 32; the pixel electrode Px1 of the first pixel unit P1 is disposed at the location of the surface of the insulating layer 32 corresponding to the first pixel unit P1; and the surface of the pixel electrode Px1 is covered with an insulating layer 33. The first signal line M31 and the second signal line M32 are disposed on the surface of the insulating layer 33, and the first signal line M31 and the second signal line M32 are covered with a second insulating layer 34; the common electrode layer 21 is disposed on the surface of the second insulating layer 34, and the location of the common electrode layer 21 corresponding to the pixel unit includes multiple stripe electrodes 22. A region of the common electrode layer 21 between the first pixel P1 and the third pixel P3 includes a common electrode opening region K.

Specifically, the insulating layers 32 and 33 are the first insulating layer. The location of the first insulating layer corresponding to the first electrode d1 is provided with a first via hole Via1. The source electrode of the first film transistor T1 is electrically connected to the second signal line M32 through the first via hole Via1 and thus electrically connected to the first signal line M31. The insulating layer 32 is provided with a second via hole Via2. The drain electrode d1 is electrically connected to the pixel electrode Px1 through the second via hole Via2. In this embodiment, the pixel electrode Px1 and the drain electrode d1 are electrically connected to each other through the via hole Via2. In other embodiment, the insulating layer 32 may be not provided, and in this case, the pixel electrode Px1 is partly overlapped with the drain electrode d1 to achieve electrical connection, and the other part of the pixel electrode Px1 is in the same layer as the drain electrode d1.

The above is only an embodiment of the present disclosure. In other embodiment, the array substrate may be as follows: the pixel electrode is disposed above the common electrode layer. That is, the common electrode layer is between the substrate of the array substrate and the pixel electrodes of the pixel units. In this case, a gate electrode is disposed on the substrate, a gate insulating layer is disposed on the gate electrode, an active layer is disposed on the gate insulating layer, a metal layer where the first electrodes, the second electrodes and the data lines are located is disposed on the active layer, the first insulating layer is disposed on the metal layer where the first electrodes, the second electrodes and the data lines are located, a third insulating layer is disposed on the common electrode layer, and a pixel electrode is disposed on the third insulating layer. The first insulating layer, the second insulating layer and the third insulating layer are provided with a second via hole, through which the pixel electrode is electrically connected to the first electrode.

Figure 6:
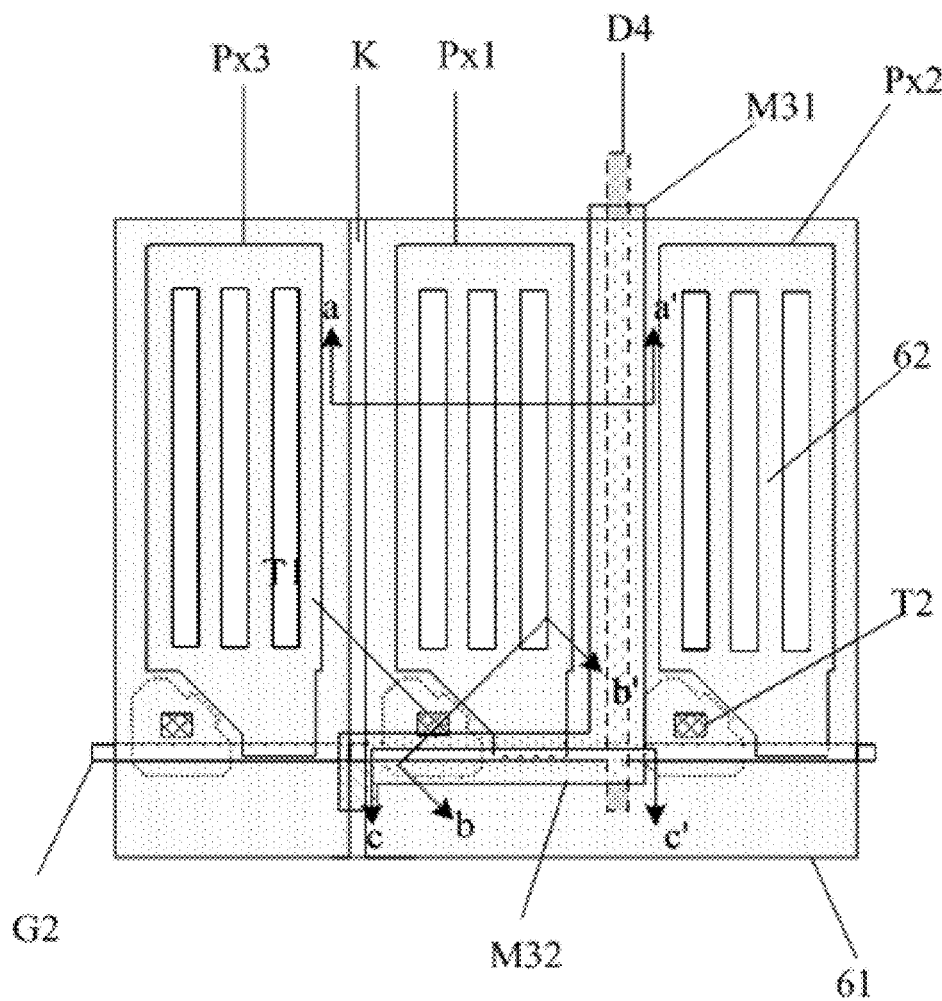
FIG. 6 is an enlarged local view of the array substrate shown in FIG. 1 according to another embodiment of the present disclosure.

Reference is made to FIG. 6, which is an enlarged local view of the array substrate shown in FIG. 1 according to another embodiment. FIG. 6 illustrates a structure in which the common electrode layer 61 is between the pixel electrodes of the pixel units and the substrate. In this case, in view of the fact that the pixel electrodes are located above the common electrode layer, the pixel electrodes are etched to form an electrode structure including multiple stripe electrodes 62, to generate a controllable electric field between the pixel electrodes and the common electrode layer 61 for driving the liquid crystal layer. A region of the common electrode layer 61 corresponding to each of the pixel electrode may be made to be multiple stripes or one stripe.

Figure 7:
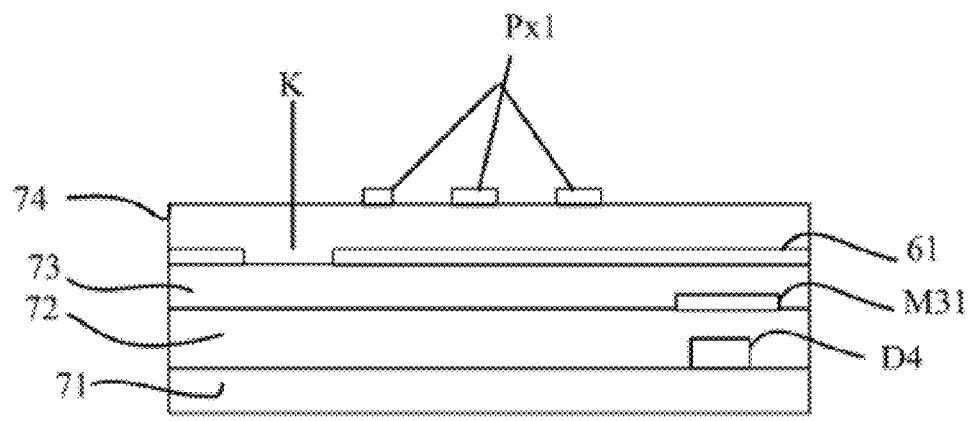
FIG. 7 is a cross-sectional view of the array substrate shown in FIG. 6 that is taken along aa'.
Figure 8:
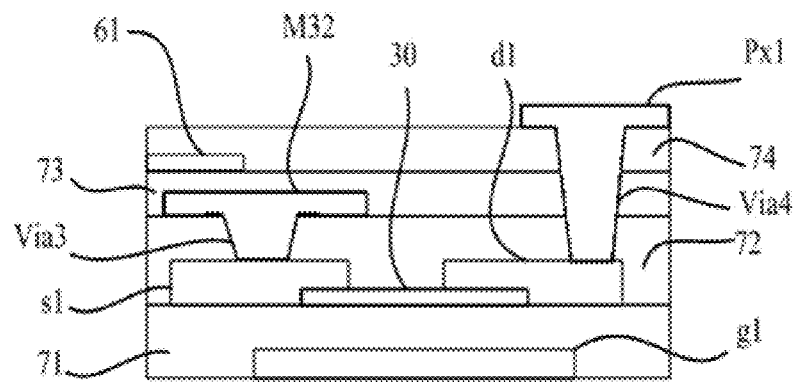
FIG. 8 is a cross-sectional view of the array substrate shown in FIG. 6 that is taken along bb'.
Figure 9:
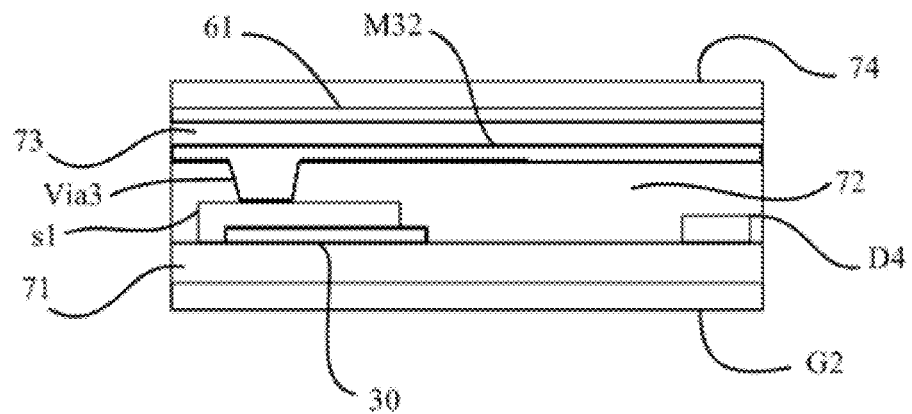
FIG. 9 is a cross-sectional view of the array substrate shown in FIG. 6 that is taken along cc'.

Reference is made to FIG. 7 to FIG. 9. FIG. 7 is a cross-sectional view of the array substrate shown in FIG. 6 that is taken along aa'. FIG. 8 is a cross-sectional view of the array substrate shown in FIG. 6 that is taken along bb'. FIG. 9 is a cross-sectional view of the array substrate shown in FIG. 6 that is taken along cc'. Similarly, this embodiment is described with an example in which the drain electrode of the film transistor is the first electrode and the source electrode of the film transistor is the second electrode. At a location corresponding to the first pixel unit P1 and a location corresponding to a region between the first pixel unit P1 and the second pixel unit P2, a gate electrode g1 of the first pixel unit P1 and a first gate line G2 are disposed on the surface of the substrate; the gate electrode g1 and the first gate line G2 are covered with a gate electrode insulating layer 71; an active layer 30 is disposed on the surface of the gate electrode insulating layer 71; a metal layer where the source electrode s1 of the first film transistor T1, the drain electrode d1 of the film transistor T1 and the first data line D4 are located is disposed on the active layer 30; the surfaces of the source electrode s1, the drain electrode d1 and the first data line D4 are covered with an insulating layer 72; the first signal line M31 and the second signal line M32 are disposed on the surface of the insulating layer 72; an insulating layer 73 is disposed on the surfaces of the first signal line M31 and the second signal line M32; a patterned common electrode layer 61 is disposed on the surface of the insulating layer 73; a region of the common electrode layer 61 corresponding to the region between the first pixel P1 and the third pixel P3 includes a common electrode opening region K; an insulating layer 74 is disposed on the surface of the common electrode layer 61; the pixel electrode Px1 is disposed on the insulating layer 74; the location of the insulating layer 72 corresponding to the source electrode s1 is provided with a via hole Via3, through which the source electrode s1 is electrically connected to the second signal line M32 and thus electrically connected to the first signal line M31; and the location of the insulating layers 72, 73 and 74 corresponding to the drain electrode d1 is provided with a via hole Via4, through which the pixel electrode Px1 is electrically connected to the drain electrode d1.

The above array substrate further includes a third signal line disposed in the same layer as the first signal line and the second signal line. The second insulating layer is provided with a third via hole, through which the common electrode is electrically connected to the third signal line. That is, the common electrode and the third signal line are electrically connected to each other by etching a hole in the insulating layer between the common electrode and the third signal line. In order to avoid leakage of light from the display panel caused by disposing the data line to be opposite to the opening region, the third signal line is disposed to be not opposite to the common electrode opening region. Furthermore, the data lines are not opposite to the common electrode opening region, i.e., no data line is opposite to the common electrode opening region.

In the embodiment, the data lines include a second data line, and the pixel units include a second set of pixel units. The second set of pixel unit includes a fourth pixel unit, a fifth pixel unit and a sixth pixel unit. The third pixel unit, the first pixel unit and the second pixel unit are adjacent to the fourth pixel unit, the fifth pixel unit and the sixth pixel unit in a column direction respectively. The fifth pixel unit includes a third film transistor. The second data line is disposed between the fourth pixel unit and the fifth pixel unit. The second data line is electrically connected to the second electrode of the first film transistor, and the second data line is electrically connected to the second electrode of the third film transistor.

Reference is made to FIG. 1, which illustrates a second set of pixel units including a fourth pixel unit P4, a fifth pixel unit P5 and a sixth pixel unit P6. The second set of pixel units is in a row below the first set of pixel unit 14. The fourth pixel unit P4 is in the same column as the third pixel unit P3, the fifth pixel unit P5 is in the same column as the first pixel unit P1, and the sixth pixel unit P6 is in the same column as the second pixel unit P2. In this case, the second data line is the data line D3. Both of the fifth and first pixel units P5 and P1 are electrically connected to the data line D3.

As can be seen from FIG. 1, the length of the common electrode opening region equals to the length of the pixel unit in the pixel-column direction. In other embodiment, the length of the common electrode opening region equals to the length of multiple successive pixel units in the pixel-column direction. In this case, similarly to the wiring in FIG. 1, part of the data line of the successive pixel units corresponding to the opening region is moved to a location above its right adjacent data line, or the whole data line corresponding to the opening region is moved to a location above its right adjacent data line. In any of the above implementations, no data line is opposite to the opening region, thereby avoiding the leakage of light from the opening region.

The array substrate according to the embodiment of the present disclosure includes at least a first set of pixel units including three pixel units that are adjacent to each other in the pixel-row direction. The data line (first signal line) of the first pixel unit is disposed above the data line (first data line)

of the second pixel unit, and the common electrode opening region is disposed in a region of the common electrode layer between the first pixel unit and the third pixel unit. Because the opening region is not opposite to the data line and thus is not aligned to the data line, the leakage of light can be effectively avoided. In addition, the opening region can be made wide, and thus the process is simple, and the wide opening region can also avoid short circuit of common electrodes on the two sides of the opening region.

Figure 10:
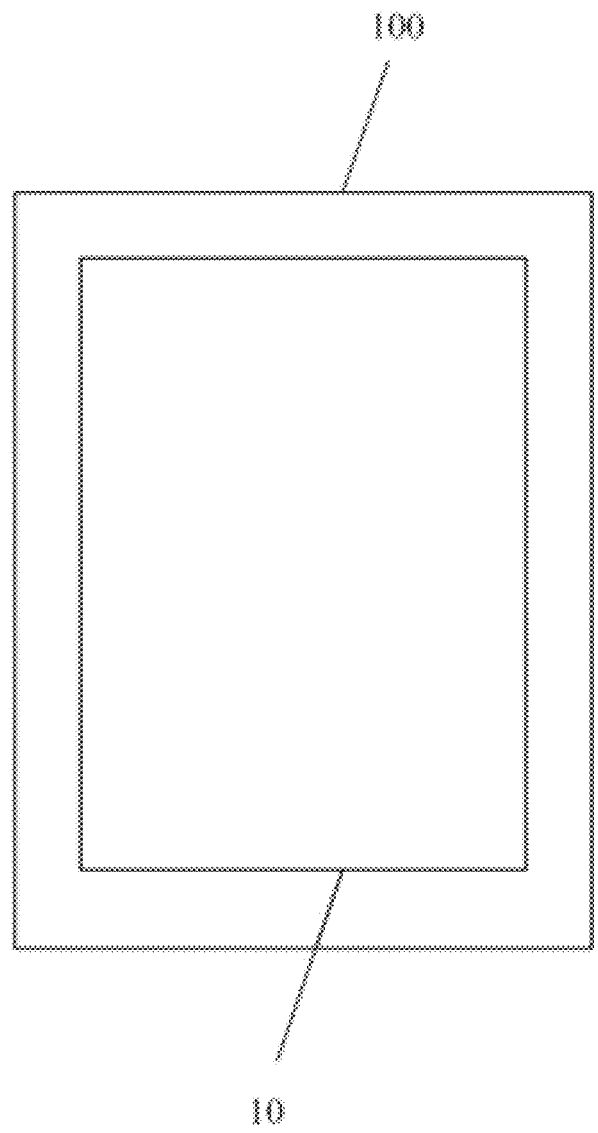
FIG. 10 is a schematic structural diagram of a display device 100 according to an embodiment of the present disclosure.

It is further provided a display device according to an embodiment of the present disclosure. The display device includes the array substrate as described above. Reference is made to FIG. 10, which is schematic structural diagram of a display device 100 according to an embodiment of the present disclosure. The display device 100 includes the array substrate 10 according to any of the above embodiments. The display device 100 may be a mobile phone, a computer, or a wearable electronic device with a display function.

Because the display device 100 according to the embodiment of the present disclosure includes the above array substrate 10, the leakage of light from the common electrode opening region can be avoided and the display quality is improved. In addition, the opening region can be made wide, and thus the process is simple, and the wide opening region can avoid short circuit of common electrodes on the two sides of the opening region.

Figure 11:
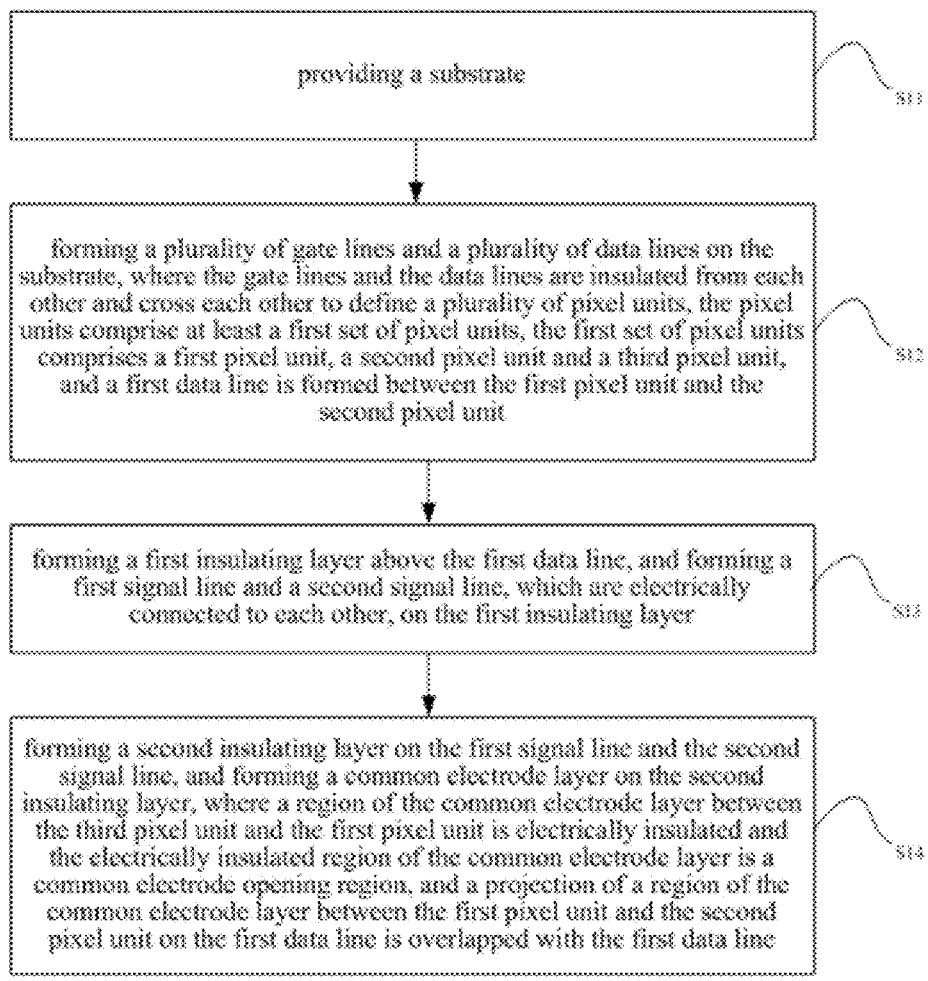
FIG. 11 is a schematic flowchart of a method for manufacturing an array substrate according to an embodiment of the present disclosure.

It is further provided a method for manufacturing an array substrate according to an embodiment of the present disclosure. Reference is made to FIG. 11, which is a schematic flowchart of the method for manufacturing the array substrate according to the embodiment of the present disclosure. The method includes steps as follows.

In step S11, a substrate is provided.

The substrate is a transparent substrate, such as a glass plate.

In step S12, a plurality of gate lines and a plurality of data lines are formed on the substrate. The gate lines and the data lines are insulated from each other and cross each other to define a plurality of pixel units. The pixel units include at least a first set of pixel units. The first set of pixel units includes a first pixel unit, a second pixel unit and a third pixel unit. A first data line is formed between the first pixel unit and the second pixel unit.

In step S13, a first insulating layer is formed above the first data line, and a first signal line and a second signal line, which are electrically connected to each other, are formed on the first insulating layer.

The first insulating layer may be in a single-layer structure or a multi-layer structure. In the embodiment illustrated in FIG. 3, the insulating layer 32 and the insulating layer 33 are between the data line D4 and the first signal line M31. Normally, the insulating layer 32 and the insulating layer 33 are in a single-layer structure. As in the above embodiment, the insulating layer 32 may not be provided if the pixel electrode Px1 and the drain electrode d1 are overlapped with each other.

In the embodiment illustrated in FIG. 7, an insulating layer 72 is between the data line D4 and the first signal line M31. Normally, the insulating layer 72 is in a single-layer structure. In this case, at least one insulating layer is between the data line D4 and the first signal line M31.

The first pixel unit includes a first film transistor, and the second pixel unit includes a second film transistor. Each film transistor includes a gate electrode, a first electrode and a second electrode.

The gate lines include a first gate line which is electrically connected to the gate electrode of the first film transistor and the gate electrode of the second film transistor.

The second electrode of the second film transistor is electrically connected to the first data line, and the second electrode of the first film transistor is electrically connected to the first signal line.

In step S14, a second insulating layer is formed on the first signal line and the second signal line, and a common electrode layer is formed on the second insulating layer. A region of the common electrode layer between the third pixel unit and the first pixel unit is electrically insulated and the electrically insulated region of the common electrode layer is a common electrode opening region, and a projection of a region of common electrode layer between the first pixel unit and the second pixel unit on the first data line is overlapped with the first data line.

The second insulating layer is usually in a single-layer structure as required by process. In the embodiment illustrated in FIG. 3, one insulating layer, i.e., the insulating layer 21, is between the common electrode layer 21 and the first signal line M31.

By replacing the data line set in the opening region with the first signal line, no data line is opposite to the opening region and thus the leakage of light from the opening region is avoided.

In the method according to the embodiment, a projection of the first signal line on the first data line is at least partly overlapped with the first data line, and a projection of the second signal line on the first gate line is at least partly overlapped with the first gate line.

In order to electrically connect the first signal line to the second electrode, the first insulating layer is provided with a first via hole, through which the first signal line is electrically connected to the second electrode.

The method may be used to make the array substrate illustrated in FIG. 2. In this case, the method includes: forming a gate electrode on the substrate; forming a gate insulating layer on the gate electrode; forming an active layer on the gate insulating layer; forming a metal layer where the first electrodes, the second electrodes and the data lines are located on the active layer; forming a pixel electrode on the metal layer where the first electrodes, the second electrodes and the data lines are located, with the pixel electrode being electrically connected to the first electrode; and forming the first insulating layer on the pixel electrode.

The method may also be used to make the array substrate illustrated in FIG. 6. In this case, the method includes: forming a gate electrode on the substrate; forming a gate insulating layer on the gate electrode; forming an active layer on the gate insulating layer; forming a metal layer where the first electrodes, the second electrodes and the data lines are located on the active layer; forming the first insulating layer on the metal layer where the first electrodes, the second electrodes and the data lines are located; forming a third insulating layer on the common electrode layer; forming a pixel electrode on the third insulating layer; and forming a second via hole on the first insulating layer, the second insulating layer and the third insulating layer, wherein the pixel electrode is electrically connected to the first electrode through the second via hole.

With the method for manufacturing the array substrate according to the embodiments of the present disclosure, the data line opposite to the common electrode opening region is moved to a location above its right adjacent data line. By disposing the opening region and the data line not opposite to each other, the leakage of light from the common electrode opening region is avoided and the display quality is ensured. In addition, the opening region can be made wide because no data line is disposed below the opening region, and thus the process is simplified, the manufacturing efficiency is improved, and the cost is reduced.

It is to be noted that the manufacturing method is based on the above structures of the array substrate, for which reference may be made to the drawings illustrating the embodiments of the array substrate. Therefore, the embodiments of the manufacturing method and the embodiments of the structures of the array substrate may be referred to each other, which will not be repeated herein.

The description of the embodiments herein enables those skilled in the art to implement or use the present disclosure. Numerous modifications to the embodiments are apparent to those skilled in the art, and the general principle herein can be implemented in other embodiments without deviating from the spirit or scope of the present disclosure. Therefore, the present disclosure should not be limited to the embodiments described herein, but in accordance with the widest scope consistent with the principle and novel features disclosed herein.

What is claimed is:

1. An array substrate, comprising:
   a substrate;
   a plurality of gate lines and a plurality of data lines disposed on the substrate, wherein the gate lines and the data lines are insulated from each other and cross each other, and are connected to a plurality of pixel units, wherein the plurality of pixel units comprise at least a first set of pixel units, wherein the first set of pixel units comprises a first pixel unit, a second pixel unit, and a third pixel unit, and wherein a first data line is disposed between the first pixel unit and the second pixel unit;
   a first insulating layer disposed above the first data line;
   first and second signal lines electrically connected to each other, and disposed on the first insulating layer,
   wherein the first pixel unit comprises a first film transistor, and the second pixel unit comprises a second film transistor, and wherein each of the first and second film transistors includes a gate electrode, a first electrode, and a second electrode,
      wherein a first gate line is electrically connected to the gate electrode of the first film transistor and to the gate electrode of the second film transistor,
      wherein the second electrode of the second film transistor is electrically connected to the first data line, and
      wherein the second electrode of the first film transistor is electrically connected to the first signal line; and
   a second insulating layer disposed on the first signal line and on the second signal line, wherein a common electrode layer is disposed on the second insulating layer, wherein a region of the common electrode layer between the third pixel unit and the first pixel unit is electrically insulated and the electrically insulated region of the common electrode layer is a common electrode opening region, and wherein a projection of a region of the common electrode layer between the first pixel unit and the second pixel unit on the first data line is overlapped with the first data line.

2. The array substrate according to claim 1, further comprising a third signal line disposed in a same layer as the first signal line and the second signal line, wherein the second insulating layer is provided with a third via hole, through which a common electrode is electrically connected to the third signal line.

3. The array substrate according to claim 2, wherein the third signal line is disposed at a location not opposite to the common electrode opening region.

4. The array substrate according to claim 1, wherein the data line is disposed at a location not opposite to the common electrode opening region.

5. The array substrate according to claim 4, wherein the data lines comprise a second data line, the pixel units comprise a second set of pixel units, the second set of pixel units comprises a fourth pixel unit, a fifth pixel unit, and a sixth pixel unit, wherein the third pixel unit, the first pixel unit, and the second pixel unit are respectively disposed adjacently to the fourth pixel unit, the fifth pixel unit, and the sixth pixel unit in a column direction, wherein the fifth pixel unit comprises a third film transistor, the second data line is disposed between the fourth pixel unit and the fifth pixel unit, the second data line is electrically connected to the second electrode of the first film transistor, and the second data line is electrically connected to the second electrode of the third film transistor.

6. An array substrate, comprising:
   a substrate;
   a plurality of gate lines and a plurality of data lines disposed on the substrate, wherein the gate lines and the data lines are insulated from each other and cross each other, and are connected to a plurality of pixel units, wherein the plurality of pixel units comprise at least a first set of pixel units, wherein the first set of pixel units comprises a first pixel unit, a second pixel unit, and a third pixel unit, and wherein a first data line is disposed between the first pixel unit and the second pixel unit;
   a first insulating layer disposed above the first data line;
   first and second signal lines electrically connected to each other, and disposed on the first insulating layer,
   wherein the first pixel unit comprises a first film transistor, and the second pixel unit comprises a second film transistor, and wherein each of the first and second film transistors includes a gate electrode, a first electrode, and a second electrode,
      wherein a first gate line is electrically connected to the gate electrode of the first film transistor and to the gate electrode of the second film transistor,
      wherein the second electrode of the second film transistor is electrically connected to the first data line, and
      wherein the second electrode of the first film transistor is electrically connected to the first signal line; and
   a second insulating layer disposed on the first signal line and on the second signal line, wherein a common electrode layer is disposed on the second insulating layer, wherein a region of the common electrode layer between the third pixel unit and the first pixel unit is electrically insulated and the electrically insulated region of the common electrode layer is a common electrode opening region, and wherein a projection of a region of the common electrode layer between the first pixel unit and the second pixel unit on the first data line is overlapped with the first data line,
   wherein a projection of the first signal line on the first data line is at least partly overlapped with the first data line; and a projection of the second signal line on the first gate line is at least partly overlapped with the first gate line.

7. The array substrate according to claim 6, wherein a gate electrode is disposed on the substrate, a gate insulating layer is disposed on the gate electrode, an active layer is disposed on the gate insulating layer, a metal layer is disposed on the active layer where the first electrode and the second electrode of each of the first and second film transistors and the data lines are located, a pixel electrode is disposed on the metal layer where the first electrode and the second electrode of each of the first and second film transistors and the data lines are located, the pixel electrode is electrically connected to the first electrode, and the first insulating layer is disposed on the pixel electrode.

8. The array substrate according to claim 7, wherein the first insulating layer is provided with a first via hole, through which the first signal line is electrically connected to the second electrode.

9. The array substrate according to claim 6, wherein a gate electrode is disposed on the substrate, a gate insulating layer is disposed on the gate electrode, an active layer is disposed on the gate insulating layer, a metal layer is disposed on the active layer where the first electrode and the second electrode of each of the first and second film transistors and the data lines are located, the first insulating layer is disposed on the metal layer where the first electrode and the second electrode of each of the film transistors and the data lines are located, a third insulating layer is disposed on the common electrode layer, a pixel electrode is disposed on the third insulating layer, wherein the first insulating layer, the second insulating layer, and the third insulating layer are provided with a second via hole, through which the pixel electrode is electrically connected to the first electrode.

10. A display device, comprising an array substrate, wherein the array substrate comprises:
a substrate;
a plurality of gate lines and a plurality of data lines disposed on the substrate, wherein the gate lines and the data lines are insulated from each other and cross each other, and are connected to a plurality of pixel units, wherein the plurality of pixel units comprise at least a first set of pixel units, wherein the first set of pixel units comprises a first pixel unit, a second pixel unit, and a third pixel unit, and wherein a first data line is disposed between the first pixel unit and the second pixel unit;
a first insulating layer disposed above the first data line;
first and second signal lines electrically connected to each other, and disposed on the first insulating layer,
wherein the first pixel unit comprises a first film transistor, and the second pixel unit comprises a second film transistor, and wherein each of the first and second film transistors includes a gate electrode, a first electrode, and a second electrode,
wherein a first gate line is electrically connected to the gate electrode of the first film transistor and to the gate electrode of the second film transistor,
wherein the second electrode of the second film transistor is electrically connected to the first data line, and
wherein the second electrode of the first film transistor is electrically connected to the first signal line; and
a second insulating layer disposed on the first signal line and on the second signal line, wherein a common electrode layer is disposed on the second insulating layer, wherein a region of the common electrode layer between the third pixel unit and the first pixel unit is electrically insulated and the electrically insulated region of the common electrode layer is a common electrode opening region, and wherein a projection of a region of the common electrode layer between the first pixel unit and the second pixel unit on the first data line is overlapped with the first data line.

11. The display device according to claim 10, wherein the display device is a mobile phone, a computer, or a wearable electronic device with a display function.

12. A method for manufacturing an array substrate, comprising:
providing a substrate;
forming a plurality of gate lines and a plurality of data lines on the substrate, wherein the gate lines and the data lines are insulated from each other and cross each other, and are connected a plurality of pixel units, wherein the plurality of pixel units comprise at least a first set of pixel units, wherein the first set of pixel units comprises a first pixel unit, a second pixel unit, and a third pixel unit, and wherein a first data line is formed between the first pixel unit and the second pixel unit;
forming a first insulating layer above the first data line;
forming a first and second signal lines electrically connected to each other, on the first insulating layer,
wherein the first pixel unit comprises a first film transistor, and the second pixel unit comprises a second film transistor, and wherein each of the first and second film transistors includes a gate electrode, a first electrode, and a second electrode,
wherein the gate lines comprise a first gate line which is electrically connected to the gate electrode of the first film transistor and to the gate electrode of the second film transistor,
wherein the second electrode of the second film transistor is electrically connected to the first data line, and
wherein the second electrode of the first film transistor is electrically connected to the first signal line;
forming a second insulating layer on the first signal line and on the second signal line; and
forming a common electrode layer on the second insulating layer, wherein a region of the common electrode layer between the third pixel unit and the first pixel unit is electrically insulated and the electrically insulated region of the common electrode layer is a common electrode opening region, and wherein a projection of a region of the common electrode layer between the first pixel unit and the second pixel unit on the first data line is overlapped with the first data line.

13. The method for manufacturing the array substrate according to claim 12, wherein a projection of the first signal line on the first data line is at least partly overlapped with the first data line; and a projection of the second signal line on the first gate line is at least partly overlapped with the first gate line.

14. The method for manufacturing the array substrate according to claim 12, further comprising forming a first via hole on the first insulating layer, wherein the first signal line is electrically connected to the second electrode through the first via hole.

15. The method for manufacturing the array substrate according to claim 14, further comprises:
forming a gate electrode on the substrate;
forming a gate insulating layer on the gate electrode;
forming an active layer on the gate insulating layer;
forming a metal layer on the active layer where the first electrode and the second electrode of each of the film transistors and the data lines are located;
forming a pixel electrode on the metal layer where the first electrode and the second electrode of each of the first and second film transistors and the data lines are located, wherein the pixel electrode is electrically connected to the first electrode; and forming the first insulating layer on the pixel electrode.

16. The method for manufacturing the array substrate according to claim 14, further comprises:
   forming a gate electrode on the substrate;
   forming a gate insulating layer on the gate electrode;
   forming an active layer on the gate insulating layer;
   forming a metal layer on the active layer where the first electrode and the second electrode of each of the film transistors and the data lines are located;
   forming the first insulating layer on the metal layer where the first electrode and the second electrode of each of the film transistors and the data lines are located;
   forming a third insulating layer on the common electrode layer;
   forming a pixel electrode on the third insulating layer; and
   forming a second via hole on the first insulating layer, the second insulating layer, and the third insulating layer, wherein the pixel electrode is electrically connected to the first electrode through the second via hole.

\* \* \* \* \*